United States Patent
Lin

(10) Patent No.: US 11,869,792 B2
(45) Date of Patent: Jan. 9, 2024

(54) ALIGNMENT MECHANISM AND ALIGNMENT METHOD OF BONDING MACHINE

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 182 days.

(21) Appl. No.: 17/517,342

(22) Filed: Nov. 2, 2021

(65) Prior Publication Data

US 2023/0138307 A1    May 4, 2023

(51) Int. Cl.
| | |
|---|---|
| *B23K 37/00* | (2006.01) |
| *H01L 21/68* | (2006.01) |
| *H01L 21/687* | (2006.01) |
| *H01L 23/00* | (2006.01) |
| *B23K 37/04* | (2006.01) |

(52) U.S. Cl.
CPC .............. *H01L 21/68* (2013.01); *B23K 37/04* (2013.01); *B23K 37/0408* (2013.01); *H01L 21/68728* (2013.01); *H01L 24/74* (2013.01); *H01L 24/80* (2013.01); *H01L 2924/37001* (2013.01)

(58) Field of Classification Search
CPC ... H01L 21/68; H01L 21/68728; H01L 24/74; H01L 24/80; H01L 2924/37001; H01L 21/67092; H01L 24/75; B23K 37/04–053
USPC .......... 228/44.3, 44.7, 47.1, 49.1, 49.4, 49.5
See application file for complete search history.

(56) References Cited

U.S. PATENT DOCUMENTS

| | | | |
|---|---|---|---|
| 6,237,832 B1* | 5/2001 | Chung ................... | B23K 3/087 228/43 |
| 2004/0222269 A1* | 11/2004 | Luo ....................... | B23K 3/0653 228/49.1 |
| 2005/0067464 A1* | 3/2005 | Wang ..................... | B23K 3/087 228/49.5 |
| 2010/0216313 A1* | 8/2010 | Iwai ................... | H01L 21/67069 438/758 |
| 2022/0122868 A1* | 4/2022 | Lin .................... | H01L 21/68728 |
| 2023/0187248 A1* | 6/2023 | Lin ........................ | H01L 21/68 156/406 |

FOREIGN PATENT DOCUMENTS

| | | | | |
|---|---|---|---|---|
| CN | 104685607 A | * | 6/2015 | ......... B32B 37/1292 |
| CN | 107622968 A | * | 1/2018 | ........... C25D 17/001 |

(Continued)

*Primary Examiner* — Kiley S Stoner
(74) *Attorney, Agent, or Firm* — Chun-Ming Shih; HDLS IPR SERVICES

(57) ABSTRACT

An alignment mechanism of a bonding machine includes a support pedestal, three first alignment members, and three second alignment members. The support pedestal includes a supporting surface having a placement area for supporting a first substrate, and the first and second alignment members are arranged around the placement area. The first alignment members each include a protruding part and a base. The protruding part is used in supporting a second substrate, and protrudes from the base and directed to the placement area. The base is used to position the first substrate. The second alignment members position the second substrate to align the first and second substrates and facilitate the bonding of the first and second substrates.

20 Claims, 6 Drawing Sheets

(56) References Cited

FOREIGN PATENT DOCUMENTS

| | | | | | |
|---|---:|---|---|---|---|
| CN | 112309945 | A | * | 2/2021 | ....... H01L 21/67132 |
| DE | 102015101897 | A1 | * | 8/2016 | ............. B26F 3/004 |
| KR | 20200021138 | A | * | 2/2020 | |
| WO | WO-2014098174 | A1 | * | 6/2014 | ............... B23K 3/00 |

* cited by examiner

ALIGNMENT MECHANISM AND ALIGNMENT METHOD OF BONDING MACHINE

TECHNICAL FIELD

The present disclosure relates to an alignment mechanism of a bonding machine, which allows rapid alignment of a wafer and a substrate and facilitates the subsequent bonding of the wafer and the substrate.

BACKGROUND

With the advancement of semiconductor technology, the thickness of wafers is continuously reduced to facilitate subsequent wafer dicing and packaging processes. In addition, the thinning of the wafer is also conducive to reducing the size of the chip, lowering the resistance, improving the calculation speed and extending the service life. However, the structure of the thinned wafer is very fragile, and the wafer is prone to warp or break in the subsequent manufacturing process, thereby decreasing the yield of the product.

In order to avoid the above problems, it is generally chosen to temporarily bond the wafer to a carrier substrate and support the thinned wafer by the carrier substrate to avoid warping or breaking of the thinned wafer during the manufacturing process.

Specifically, an adhesive may be applied to the surface of the carrier substrate and the wafer, and then the carrier substrate and the wafer are moved to a bonding machine and aligned. Subsequently, the carrier substrate and the wafer are bonded by increasing the temperature. After the bonding is completed, the wafer may be subjected to thinning, etching and metallization processes, etc., and lastly the wafer and the carrier substrate are separated.

Although bonding of the wafer and the carrier substrate can be done through the above steps, the alignment mechanism of a common bonding machine still has the problems of poor accuracy and low alignment efficiency, which affects the efficiency and yield of the process to a certain extent.

SUMMARY

In order to address the above-mentioned problems, the present invention proposes an alignment mechanism of a bonding machine, which effectively improves the accuracy and efficiency of the alignment between a wafer and a carrier substrate, and is beneficial to improve the efficiency and yield of the manufacturing process. In addition, by using an alignment mechanism of the present invention, the cost of installing multiple detectors on the machine can be saved.

An object of the present disclosure is to provide an alignment mechanism of a bonding machine, which mainly comprises a support pedestal configured with three first alignment members and three second alignment members, wherein the first and second alignment members are configured to move along a direction parallel to a supporting surface of the support pedestal and position a substrate through moving close to or away from the substrate.

In positioning a substrate, the first and second alignment members only need to move along a direction parallel to the supporting surface and do not need to raise or lower relative to the supporting surface. This is beneficial in simplifying the steps of aligning the substrate and the mechanisms of the machine.

An object of the present disclosure is to provide an alignment mechanism of a bonding machine, which mainly comprises a support pedestal configured with three alignment members and three support members, wherein the alignment members and the support members are configured to move along a direction parallel to a supporting surface of the support pedestal.

When the alignment members move toward a substrate, they contact and push the substrate to position the substrate. The support members are used in supporting a substrate, and the alignment members may align the substrate supported by the support members.

To achieve the abovementioned objects, the present disclosure provides an alignment mechanism of a bonding machine, comprising: a support pedestal including a supporting surface for supporting a first substrate, wherein the supporting surface has a placement area; three first alignment members arranged around the placement area of the supporting surface for positioning the first substrate through moving close to or away from the placement area and for supporting a second substrate, wherein the first alignment members each include a protruding part and a base, the protruding part being protruding from the base and directed to the placement area, the base being closer to the supporting surface than the protruding part, and the base being used to position the first substrate; and three second alignment members arranged around the placement area of the supporting surface for positioning the second substrate supported by the first alignment members through moving close to or away from the placement area, wherein the first alignment members move away from the placement area to place the second substrate thereon onto the first substrate.

The present disclosure provides another alignment mechanism of a bonding machine, comprising: a support pedestal including a supporting surface for supporting a first substrate, wherein the supporting surface has a placement area; three alignment members arranged around the placement area of the supporting surface for positioning the first substrate and a second substrate through moving close to or away from the placement area; and three support members arranged around the placement area of the supporting surface, the support members being configured to move close to or away from the placement area and being used to support the second substrate, wherein the alignment members move toward the placement area to position the second substrate supported by the support members, and the support members subsequently move away from the placement area to place the second substrate thereon onto the first substrate, wherein the support members each include a protruding part and a base, the protruding part being protruding from the base and directed to the placement area, the base being closer to the supporting surface than the protruding part.

The present disclosure also provides an alignment method for a bonding machine, comprising: placing a first substrate on a supporting surface of a support pedestal, wherein the supporting surface has a placement area; three alignment members moving toward the placement area to position the first substrate placed on the supporting surface to align the first substrate with the placement area; three support members moving toward the placement area and being used in supporting a second substrate; the alignment members moving toward the placement area to position the second substrate supported by the support members to align the second substrate with the first substrate; and the support members moving away from the placement area to place the second substrate thereon onto the first substrate.

The alignment mechanism of a bonding machine, wherein the protruding part of the first alignment members and the support members protrudes along a radial direction of the support pedestal and is used in supporting a second substrate. The first and second alignment members, the alignment members and the support members move along said radial direction close to or away from the placement area.

The alignment mechanism of a bonding machine, wherein the protruding part of the first alignment members and the support members includes an inclined face inclined in a direction toward the supporting surface of the support pedestal or the placement area.

The alignment mechanism of a bonding machine, comprising at least six connecting rods located on the supporting surface of the support pedestal and arranged around the placement area of the supporting surface, wherein each of the first and second alignment members and the alignment members and support members includes a fixing hole so as to be sleeved on one of the connecting rods.

The alignment method for a bonding machine, wherein one of the support members moves away from the placement area to obliquely place the second substrate thereon on the first substrate.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
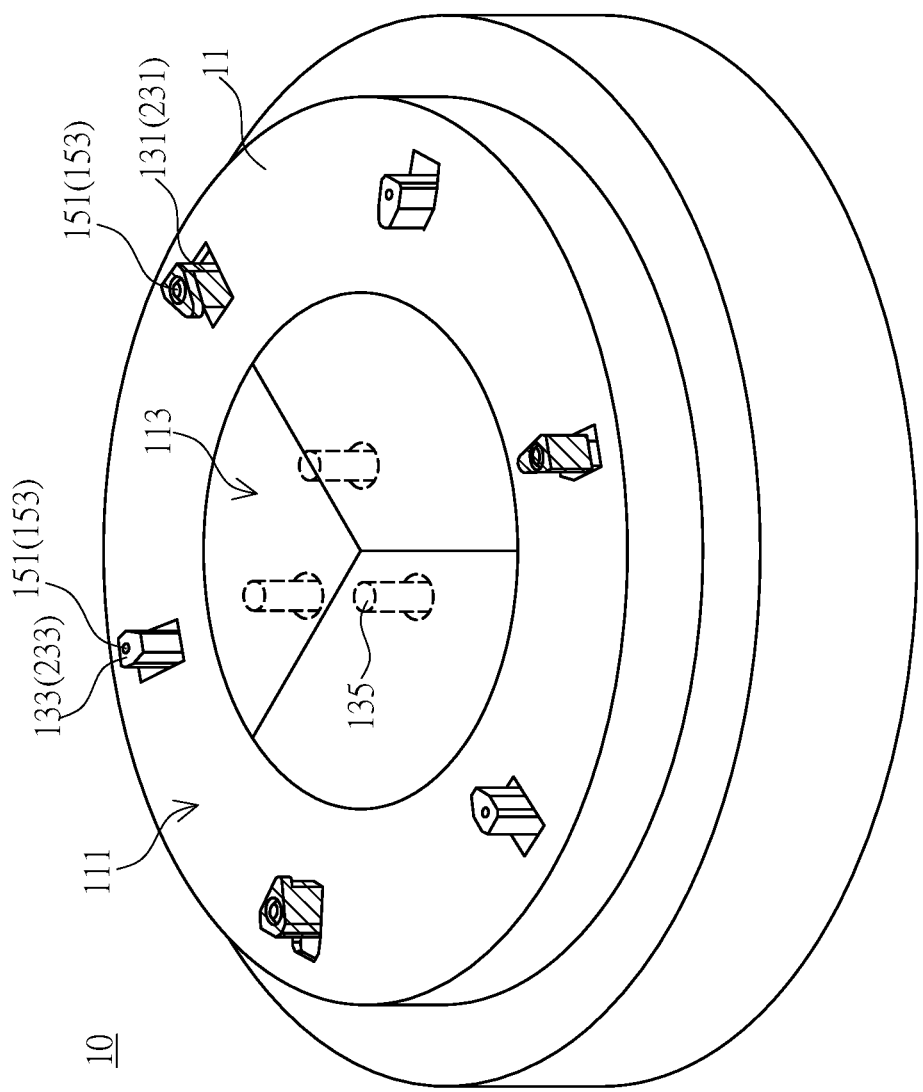
FIG. 1 is a perspective view illustrating an alignment mechanism of a bonding machine according to one embodiment of the present invention.

Please refer to FIG. 1, which is a perspective view illustrating an alignment mechanism of a bonding machine according to one embodiment of the present invention. As shown in the figure, an alignment mechanism 10 of a bonding machine mainly comprises a support pedestal 11, at least three first alignment members 131 and at least three second alignment members 133, wherein the first alignment members 131 and the second alignment members 133 are arranged at an area near an edge or a periphery of the support pedestal 11. For example, a placement area 113 may be defined on a supporting surface 111 of the support pedestal 11, wherein the supporting surface 111 and the placement area 113 are used for the placement of a substrate. The first alignment members 131 and the second alignment members 133 may be disposed in a spaced manner. As shown in FIG. 1, the elements with section line are the first alignment members 131. The first alignment members 131 and the second alignment members 133 are arranged around the placement area 113, and they may move close to or away from the placement area 113.

The alignment mechanism 10 positions a first substrate 121 and a second substrate 123 located above the support pedestal 11 through the first alignment members 131 and the second alignment members 133, respectively, such that the first substrate 121 overlaps with the second substrate 123, wherein the second substrate 123 aligns with the first substrate 121.

A minimum spacing between the first alignment members 131 and a minimum spacing between the second alignment members 133 may be adjusted according to the sizes of the first substrate 121 and the second substrate 123, respectively. Specifically, the first substrate 121 and the second substrate 123 are in the shape of a round disc, wherein a circle formed by the first alignment members 131 in an alignment state has a similar size to the first substrate 121, and a circle formed by the second alignment members 133 in an alignment state has a similar size to the second substrate 123.

Figure 2:
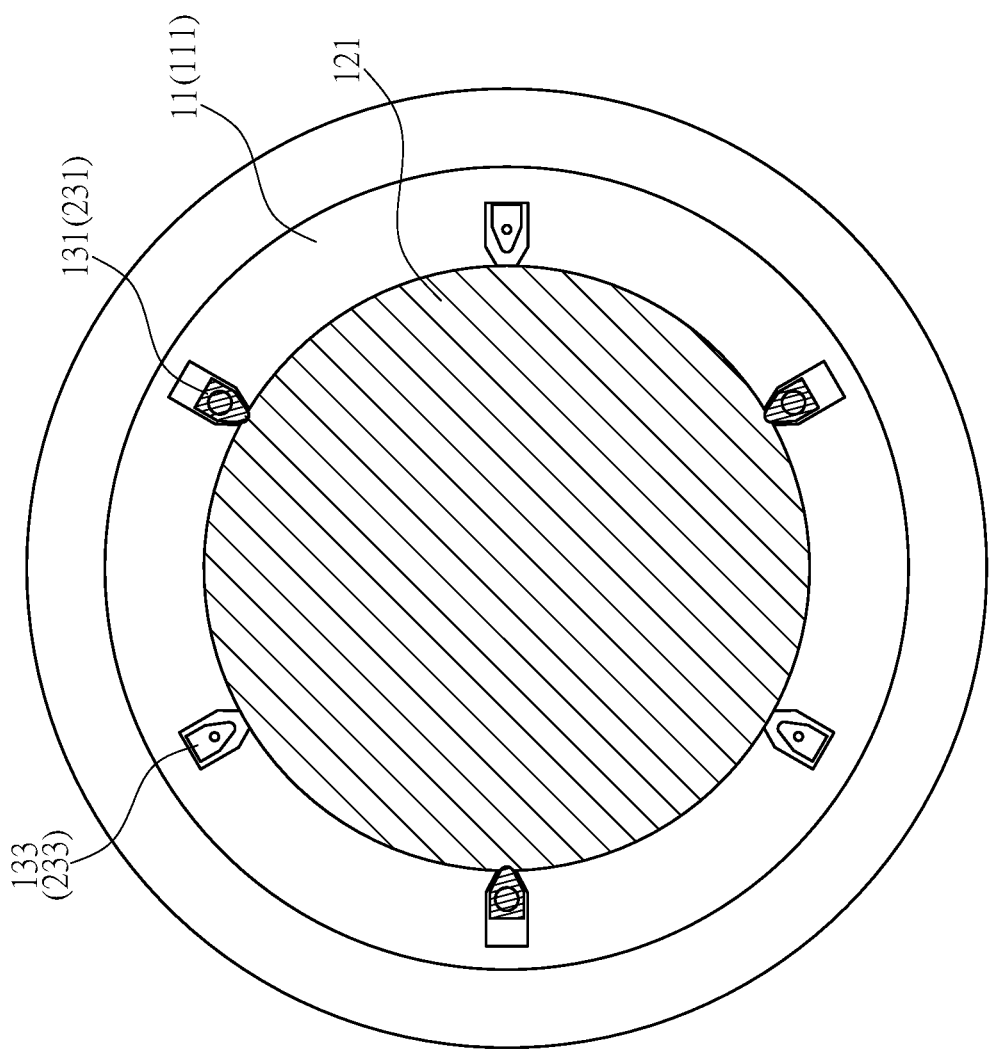
FIG. 2 is a top view illustrating an alignment mechanism of a bonding machine positioning a first substrate according to one embodiment of the present invention.

The supporting surface 111 of the support pedestal 11 may be used for supporting the first substrate 121, wherein the first substrate 121 may be placed within or near to the placement area 113 of the supporting surface 111, as shown in FIG. 2. The first alignment members 131 are located on the supporting surface 111 of the support pedestal 11 and move close to or away from the placement area 113 along a direction parallel to the supporting surface 111 to position the first substrate 121 placed on the supporting surface 111 or placement area 113 of the support pedestal 11. For example, the supporting surface 111 and/or the placement areal 113 of the support pedestal 11 may take the shape of a circle, and the first alignment members 131 may move along a radial direction of the supporting surface 111 close to or away from the placement area 113 to position the first substrate 121.

Specifically, the first substrate 121 is generally not precisely located within the placement area 113 when it is placed onto the placement area 113 of the support pedestal 11. The first alignment members 131 may simultaneously or non-simultaneously move toward the placement area 113, and contact with and position the first substrate 121, such that the first substrate 121 is precisely placed within the placement area 113.

Figure 5:
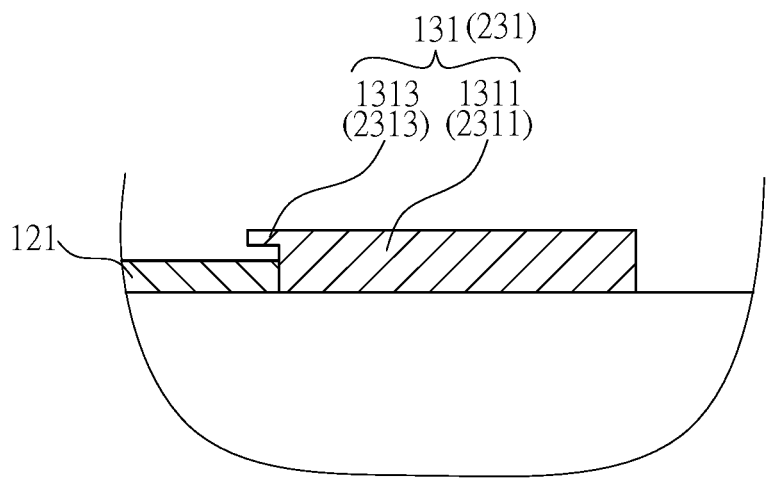
FIG. 5 is a side view illustrating first alignment members of an alignment mechanism of a bonding machine aligning a first substrate according to one embodiment of the present invention.
Figure 6:
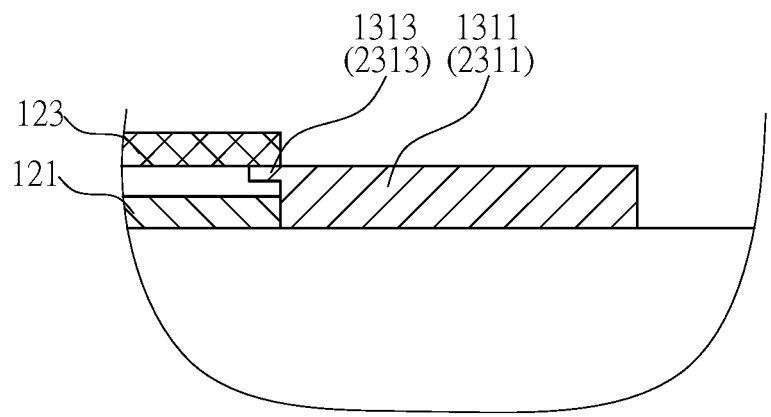
FIG. 6 is a side view illustrating first alignment members of an alignment mechanism of a bonding machine supporting a second substrate according to one embodiment of the present invention.
Figure 7:
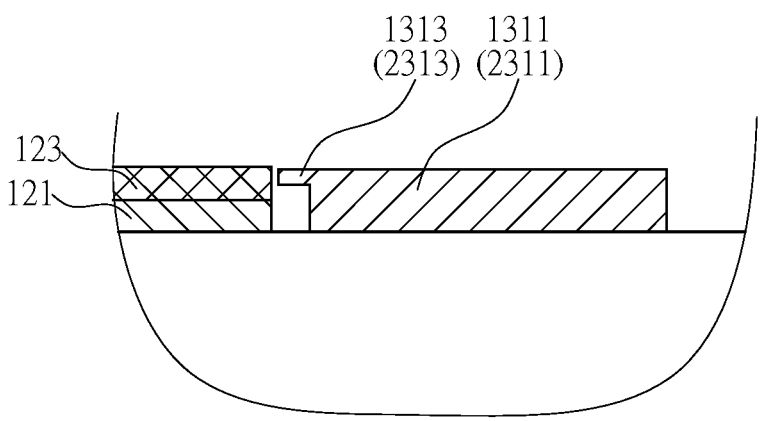
FIG. 7 is a side view illustrating first alignment members of an alignment mechanism of a bonding machine placing a second substrate according to one embodiment of the present invention.

As shown in FIG. 5 to FIG. 7, in one embodiment of the present invention, the first alignment members 131 each include a base 1311 and a protruding part 1313, wherein the base 1311 is closer to the supporting surface 111 of the support pedestal 11 than the protruding part 1313 is, and the protruding part 1313 protrudes from the base 1311 and is directed toward the placement area 113 of the support pedestal 11. For example, the protruding part 1313 may protrude along a radial direction of the supporting surface 111 and/or the placement area 113 of the support pedestal 11. When the first alignment members 131 move toward and close to the placement area 113 and the first substrate 121, the bases 1311 of the first alignment members 131 push and position the first substrate 121.

Figure 3:
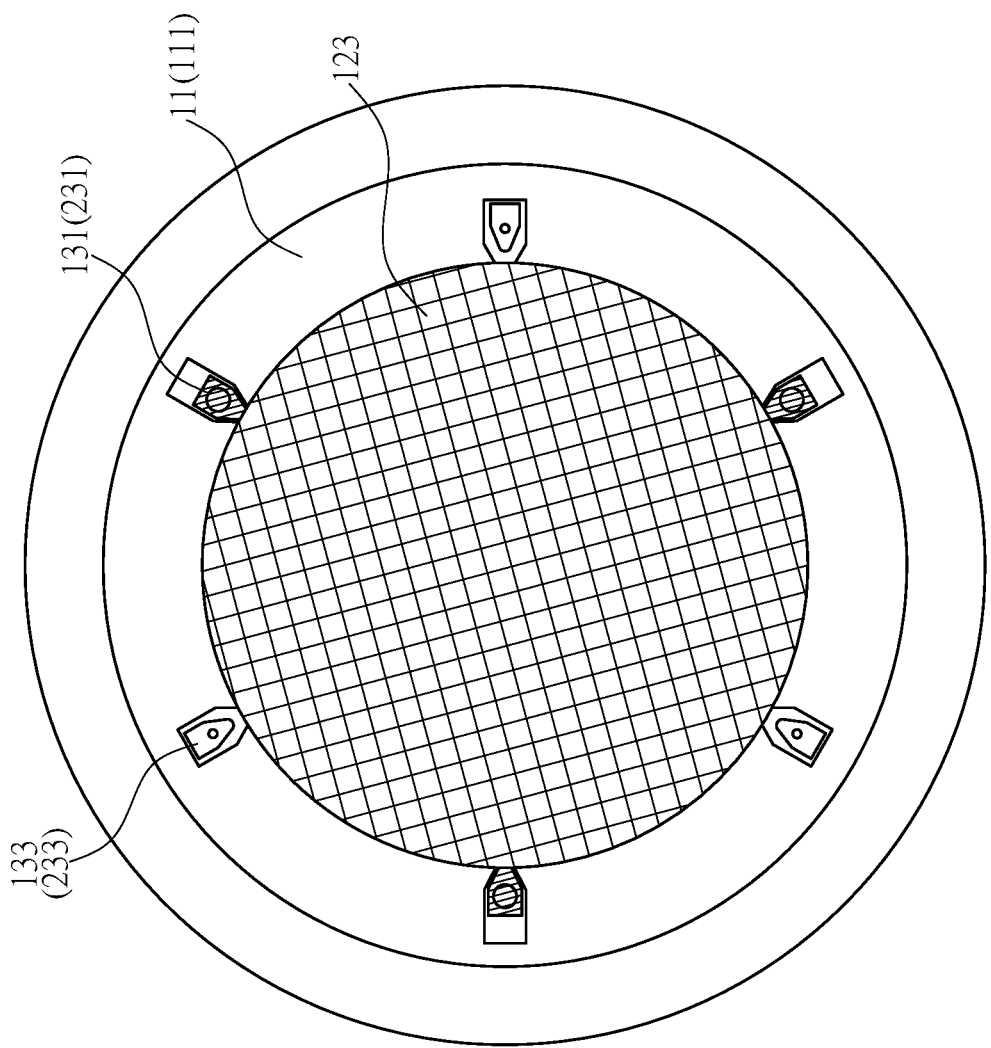
FIG. 3 is a top view illustrating an alignment mechanism of a bonding machine supporting a second substrate according to one embodiment of the present invention.

After positioning the first substrate 121, the second substrate 123 may be placed above the placement area 113. Now the first alignment members 131 maintain in a position where the first substrate 121 is positioned, and are used for supporting the second substrate 123, for example, using the protruding parts 1313 of the first alignment members 131 to support the second substrate 123, as shown is FIG. 3, FIG. 5 and FIG. 6.

Figure 4:
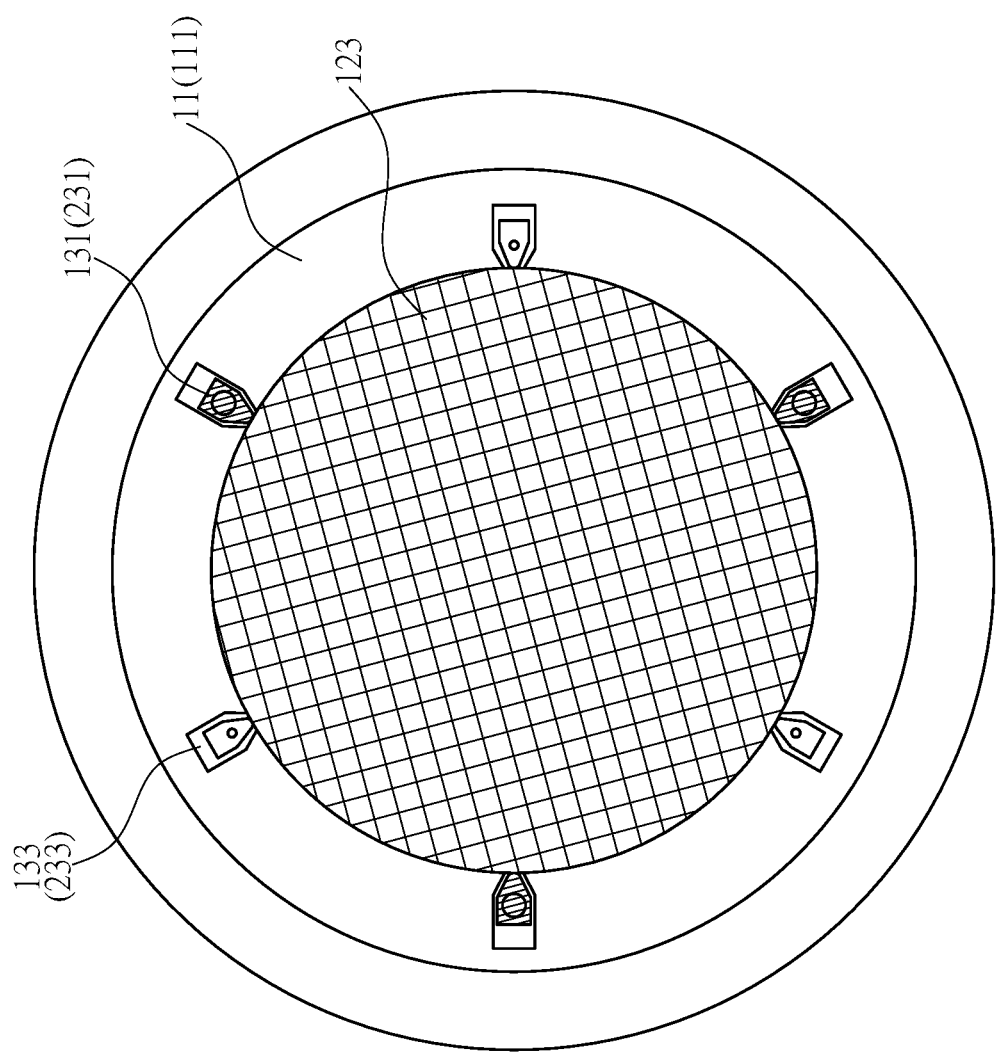
FIG. 4 is a top view illustrating an alignment mechanism of a bonding machine positioning a second substrate according to one embodiment of the present invention.

Subsequently, the second alignment members 133 move toward and close to the placement area 113 and the second substrate 123, and push and position the second substrate 123 supported by the first alignment members 131. For example, the second alignment members 133 may move along a radial direction of the supporting surface 111, as shown in FIG. 4 and FIG. 6. In practical applications, the second alignment members 133 are not used for supporting a substrate, and thus the second alignment members 133 each may be a columnar body having a cross section of any shape, wherein the second alignment members 133 do not need to be configured with a protruding part as described above.

Through the above alignment process, the second substrate 123 is aligned with the first substrate 121, wherein the second substrate 123 is still placed on the first alignment members 131. Then the first alignment members 131 move away from the first substrate 121, the second substrate 123 and/or the placement area 113, for example, move away along a radial direction of the supporting surface 111, such that the second substrate 123 falls from the first alignment members 131 and is placed onto the first substrate 121, as shown in FIG. 7.

In practical applications, three first alignment members 131 may move away from the second substrate 123 in a non-simultaneous manner. For example, one of the first alignment members 131 first moves away from the second substrate 123 while the other two first alignment members 131 remain still, such that the second substrate 123 is obliquely placed on the first substrate 121. Then the other two first alignment members 131 move away from the second substrate 123 to lay the second substrate 123 flat on the first substrate 121.

In one embodiment of the present invention, when the first alignment members 131 move away from the second substrate 123, the second alignment members 133 may stay still to avoid a displacement of the second substrate 123 relative to the first substrate 121 caused by a displacement of the first alignment members 131 relative to the second substrate 123.

Figure 8:
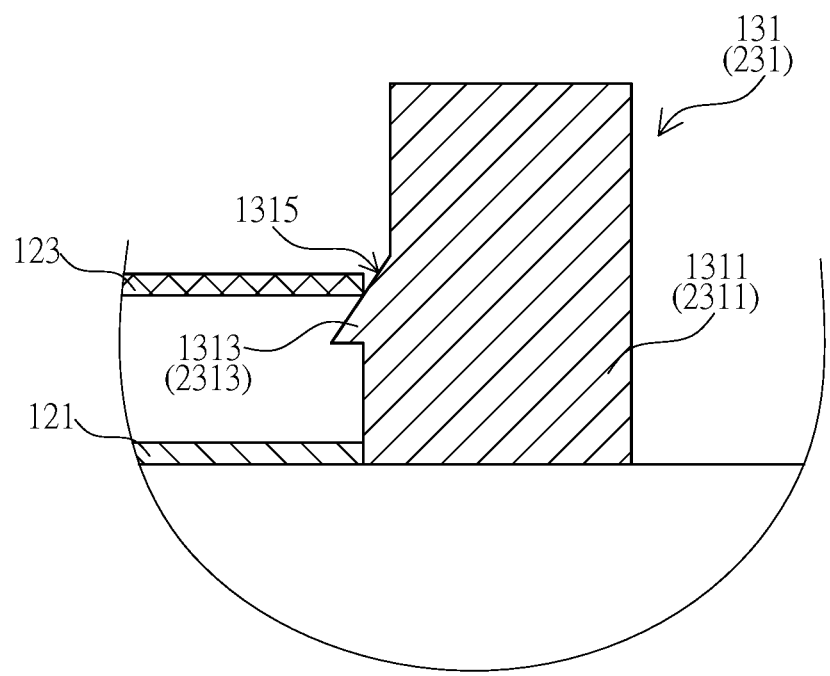
FIG. 8 is a side view illustrating first alignment members of an alignment mechanism of a bonding machine supporting a second substrate according to another embodiment of the present invention.
Figure 9:
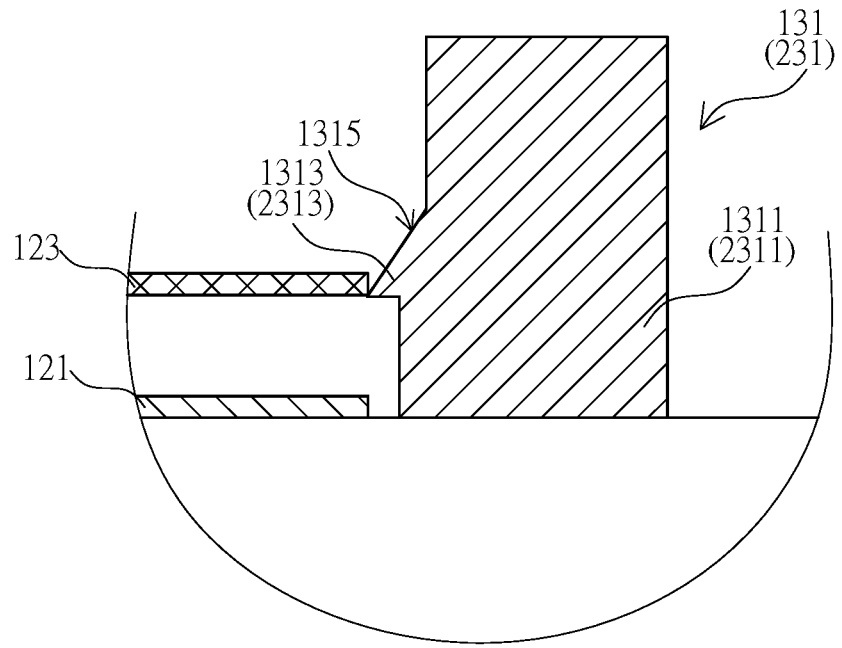
FIG. 9 is a side view illustrating first alignment members of an alignment mechanism of a bonding machine placing a second substrate according to another embodiment of the present invention.

As shown in FIG. 8 and FIG. 9, the protruding part 1313 of the first alignment members 131 may include a inclined face 1315, wherein the inclined face 1315 is inclined in a direction toward the supporting surface 111 of the support pedestal 11 or the placement area 113, and the second substrate 123 is placed on the inclined faces 1315 of the protruding parts 1313 of the first alignment members 131. By configuring the protruding part 1313 with the inclined face 1315, the second substrate 123 supported by the protruding part 1313 may be guided to slide along the inclined face 1315 and fall onto the first substrate 121, and a displacement of the second substrate 123 relative to the first substrate 121 caused by a displacement of the first alignment members 131 relative to the second substrate 123 may be avoided.

In one embodiment of the present invention, the alignment mechanism 10 may include at least three lift pins 135 configured on the supporting surface 111 of the support pedestal 11, wherein the first alignment members 131 and the second alignment members 133 are arranged around the lift pins 135. For example, the lift pins 135 may be configured within the placement area 113 of the support pedestal 11. The lift pins 135 may raise or lower relative to the supporting surface 111, wherein lift pins 135 raise to receive and support the first substrate 121, and the lift pins 135 lower to place the first substrate 121 thereon onto the supporting surface 111 of the support pedestal 11. In addition, the lift pins 135 may lower simultaneously or non-simultaneously to lay the first substrate 121 flat or obliquely place the first substrate 121 on the supporting surface 111 of the support pedestal 11. The lift pins 135 are not essential elements of the present invention. In other embodiments, the first substrate 121 may also be directly placed onto the placement area 113 of the support pedestal 11.

In another embodiment of the present invention, in FIG. 1 to FIG. 9, the first alignment members 131 each may be a support member 231, and the second alignment members 133 each may be an alignment member 233, wherein the quantity, position of arrangement and structure of the support members 231 and the alignment members 233 may be the same as those of the first and second alignment members 131/133.

Three support members 231 and three alignment members 233 are arranged around the placement area 113 of the supporting surface 111, and configured to move close to or away from the placement area 113. In certain embodiments of the present invention, both the first substrate 121 and the second substrate 123 are aligned by the alignment members 233, and the second substrate 123 is supported by the support members 231.

In practical applications, the first substrate 121 may be placed to the placement area 113 of the supporting surface 111 of the support pedestal 11, and subsequently the alignment members 233 move toward and close to the first substrate 121 and the placement area 113, for example, move along a radial direction of the support pedestal 11. The alignment members 233 contact and position the first substrate 121, such that the first substrate 121 is aligned with the placement area 113 of the support pedestal 11.

After positioning the first substrate 121, the support members 231 move toward and close to the first substrate 121 and the placement area 113, while the alignment members 233 move away from the first substrate 121. The alignment members 233 may move away from the first substrate 121 after the support members 231 come to a stop, or the alignment members 233 may also be driven away from the first substrate 121 before the support members 231 come to a stop. In theory, the alignment members 233 moving away from the first substrate 121 after the support members 231 come to a stop may better avoid a displacement of the first substrate 121 during the process of displacement of the alignment members 233 relative to the first substrate 121.

After the alignment members 233 leave the first substrate 121, the second substrate 123 may be placed on the support members 231, wherein the second substrate 123 is supported by the support members 231 and is not in contact with the first substrate 121. Specifically, the structure of the support members 231 is similar to that of the first alignment members 131, and each include a base 2311 and a protruding part 2313, wherein the protruding part 2313 is used for supporting the second substrate 123.

Subsequently, the alignment members 233 move toward and close to the second substrate 123. For example, the alignment members 233 may move along a radial direction of the supporting surface 111 of the support pedestal 11. The alignment members 233 contact and position the second substrate 123 supported by the support member 231, such that the second substrate 123 is aligned with the first substrate 121 and/or the placement area 113 of the support pedestal 11.

After aligning the first substrate 121 and the second substrate 123, the support members 231 leave the placement area 113, the first substrate 121 and/or the second substrate 123, wherein the second substrate 123 falls from the protruding parts 2313 of the support members 231 and is placed onto the first substrate 121. When the support members 231 move away from the second substrate 123, the alignment members 233 may stay still and remain in contact with the second substrate 123 to avoid a displacement of the second substrate 123 during the process of displacement of the support members 231 relative to the second substrate 123.

Further, three support members 231 may move away from the second substrate 123 in a non-simultaneous manner. For example, one of the support members 231 first moves away from the second substrate 123, while the other two support members 231 remain still, such that the second substrate 123 is obliquely placed on the first substrate 121. Then the other two support members 231 move away from the second substrate 123, and lay the second substrate 123 flat on the first substrate 121, such that the second substrate 123 overlaps and aligns with the first substrate 121.

In the process of aligning or positioning the first substrate 121 and the second substrate 123 by the alignment mechanism 10 of the present invention, the first alignment members 131, the second alignment members 133, the support members 231 and/or the alignment members 233 only need to move along a direction parallel to the supporting surface 111 of the support pedestal 11, and do not need to raise or lower relative to the supporting surface 111 of the support pedestal 11. This is beneficial in simplifying the steps and mechanisms for aligning the first substrate 121 and the second substrate 123. In one embodiment of the present invention, the first alignment members 131, the second alignment members 133, the support members 231 and/or the alignment members 233 may not only move along a direction parallel to the supporting surface 111 of the support pedestal 11, but also raise or lower along a direction perpendicular to the supporting surface 111.

In one embodiment of the present invention, as shown in FIG. 1, the supporting surface 111 of the support pedestal 11 may be configured with six or more connecting rods 151, arranged around the placement area 113 of the supporting surface 111. The first and second alignment members 131/133, the support members 231 and the alignment members 233 on the other hand each include a fixing hole 153, and each is sleeved on one of the connecting rods 153 through the fixing hole 153. In practical applications, based on the sizes of the first substrate 121 and the second substrate 123, first and second alignment members 131/133, support members 231 and alignment members 233 having different forms or sizes may be chosen and fixed to the connecting rods 151, such that the alignment mechanism 10 of the present invention may be used in aligning substrates of two different kinds or more.

In one embodiment of the present invention, the first substrate 121 includes but is not limited to a wafer or a chip, and the second substrate 123 includes but is not limited to a sapphire carrier substrate.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

I claim:

1. An alignment mechanism of a bonding machine, comprising:
a support pedestal including a supporting surface for supporting a first substrate, wherein the supporting surface has a placement area;
three first alignment members arranged around the placement area of the supporting surface for positioning the first substrate through moving toward or away from the placement area and for supporting a second substrate, wherein the first alignment members each include a protruding part and a base, the protruding part being protruding from the base and directed to the placement area, the base being closer to the supporting surface than the protruding part being to the support surface, and the base being used to position the first substrate; and
three second alignment members arranged around the placement area of the supporting surface for positioning the second substrate supported by the first alignment members through moving toward or away from the placement area, wherein the first alignment members move away from the placement area to place the second substrate thereon onto the first substrate.

2. The alignment mechanism according to claim 1, wherein the protruding part protrudes from the base along a radial direction of the support pedestal and is used to support the second substrate, and the first alignment members and the second alignment members move along said radial direction toward or away from the placement area.

3. The alignment mechanism according to claim 2, wherein the protruding part includes an inclined face inclined in a direction toward the supporting surface of the support pedestal or the placement area.

4. The alignment mechanism according to claim 1, comprising at least six connecting rods located on the supporting surface of the support pedestal and arranged around the placement area of the supporting surface, wherein each of the first and second alignment members includes a fixing hole so as to be sleeved on one of the connecting rods.

5. The alignment mechanism according to claim 1, comprising at least three lift pins disposed on the supporting surface of the support pedestal with the first and second alignment members being arranged around the lift pins, wherein the lift pins are configured to raise or lower relative to the supporting surface and are used in supporting the first substrate.

6. The alignment mechanism according to claim 5, wherein one of the lift pins lowers relative to the supporting surface to obliquely place the positioned first substrate on the supporting surface.

7. The alignment mechanism according to claim 1, wherein one of the first alignment members moves away from the placement area to obliquely place the positioned second substrate on the first substrate.

8. An alignment mechanism of a bonding machine, comprising:

a support pedestal including a supporting surface for supporting a first substrate, wherein the supporting surface has a placement area;

three alignment members arranged around the placement area of the supporting surface for positioning the first substrate and a second substrate through moving toward or away from the placement area; and three support members arranged around the placement area of the supporting surface, the support members being configured to move toward or away from the placement area and being used to support the second substrate, wherein the alignment members move toward the placement area to position the second substrate supported by the support members, and the support members subsequently move away from the placement area to place the second substrate thereon onto the first substrate, wherein the support members each include a protruding part and a base, the protruding part being protruding from the base and directed to the placement area, and the base being closer to the supporting surface than the protruding part being to the supporting surface.

9. The alignment mechanism according to claim 8, wherein the protruding part protrudes from the base along a radial direction of the support pedestal and is used to support the second substrate, and the alignment members and the support members move along said radial direction toward or away from the placement area.

10. The alignment mechanism according to claim 9, wherein the protruding part includes an inclined face inclined in a direction toward the supporting surface of the support pedestal or the placement area.

11. The alignment mechanism according to claim 8, comprising at least six connecting rods located on the supporting surface of the support pedestal and arranged around the placement area of the supporting surface, wherein each of the alignment members and support members includes a fixing hole so as to be sleeved on one of the connecting rods.

12. The alignment mechanism according to claim 8, comprising at least three lift pins disposed on the supporting surface of the support pedestal with the alignment members and the support members being arranged around the lift pins, wherein the lift pins are configured to raise or lower relative to the supporting surface and are used in supporting the first substrate.

13. The alignment mechanism according to claim 12, wherein one of the lift pins lowers relative to the supporting surface to obliquely place the positioned first substrate on the supporting surface.

14. The alignment mechanism according to claim 8, wherein one of the support members moves away from the placement area to obliquely place the positioned second substrate on the first substrate.

15. An alignment method for a bonding machine, comprising:

placing a first substrate on a supporting surface of a support pedestal, wherein the supporting surface has a placement area;

three alignment members moving toward the placement area to position the first substrate placed on the supporting surface to align the first substrate with the placement area;

three support members moving toward the placement area and being used in supporting a second substrate; wherein each of the support members includes a protruding part and a base, the protruding part being protruding from the base and directed to the placement area, the base being closer to the supporting surface than the protruding part being to the support surface; wherein when the support members move toward the placement area and the first substrate, the bases of the support members position the first substrate;

the alignment members moving toward the placement area to position the second substrate supported by the support members to align the second substrate with the first substrate; and the support members moving away from the placement area to place the second substrate thereon onto the first substrate.

16. The alignment method according to claim 15, comprising:

one of the support members moving away from the placement area at first to obliquely place the second substrate thereon on the first substrate; and the other two support members moving away from the placement area to place the second substrate onto the first substrate.

17. The alignment method according to claim 15, comprising:

placing the first substrate on three lift pins;

the lift pins lowering relative to the supporting surface to place the first substrate onto the supporting surface.

18. The alignment method according to claim 15, comprising:

placing the first substrate on three lift pins;

one of the lift pins lowering relative to the supporting surface to obliquely place the first substrate to the supporting surface; and the other two lift pins lowering relative to the supporting surface to place the first substrate onto the supporting surface.

19. The alignment method according to claim 15, comprising:

the alignment members moving away from the placement area after the support members move toward the placement area and come to a stop.

20. The alignment method according to claim 15, comprising:

placing the second substrate onto the support members after the alignment members move away from the placement area and come to a stop.

* * * * *